(12) United States Patent
Chen

(10) Patent No.: US 7,221,551 B2
(45) Date of Patent: May 22, 2007

(54) CASCADED GATE-DRIVEN ESD CLAMP

(75) Inventor: Ker-Min Chen, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 186 days.

(21) Appl. No.: 10/866,453

(22) Filed: Jun. 11, 2004

(65) Prior Publication Data

US 2005/0275989 A1 Dec. 15, 2005

(51) Int. Cl.
*H01T 23/00* (2006.01)
*H02H 3/22* (2006.01)
*H02H 9/00* (2006.01)
*H02H 3/20* (2006.01)
*H02H 9/04* (2006.01)

(52) U.S. Cl. ................ 361/230; 361/111; 361/56; 361/91.1

(58) Field of Classification Search ............ None
See application file for complete search history.

(56) References Cited

U.S. PATENT DOCUMENTS

| 6,002,568 | A | 12/1999 | Ker et al. |
| 6,249,410 | B1 | 6/2001 | Ker et al. |
| 6,671,153 | B1 | 12/2003 | Ker et al. |
| 6,674,622 | B1 | 1/2004 | Yu et al. |
| 6,954,098 | B2 * | 10/2005 | Hsu et al. ............ 327/313 |
| 7,009,229 | B1 * | 3/2006 | Lin et al. ............ 257/287 |

* cited by examiner

*Primary Examiner*—Stephen W. Jackson
*Assistant Examiner*—Dharti H. Patel
(74) *Attorney, Agent, or Firm*—Baker & McKenzie LLP

(57) ABSTRACT

A method is provided for semiconductor ESD protection in a mixed voltage device using a cascaded gate driven NMOS clamp circuit. Use of a bias circuit allows for an external I/O signal to have a voltage higher than the internal circuit power supply voltage so that a proper trigger level is provided in reference to an external power supply reference. A cascaded gate NMOS clamp circuit dissipates charge from an ESD event from the higher external I/O signal level without interfering with the normal operation of the internal or "core" circuits.

18 Claims, 3 Drawing Sheets

CASCADED GATE-DRIVEN ESD CLAMP

TECHNICAL FIELD

Disclosed embodiments herein relate generally to the field of electrostatic discharge (ESD) protection circuits. The disclosed embodiments relate more specifically to ESD protection schemes for MOS technology integrated circuits (ICs) using ESD protection circuits that have gate-driven charge-dissipation transistors.

BACKGROUND

Reliability in semiconductor circuits is an important aspect of chip design, especially with the increasing complexity of the circuits and the increased density of the silicon on which the circuits reside. Connections to IC inputs, outputs, and power are susceptible to electrostatic discharge (ESD) events that can damage internal components. Fundamentally, an ESD event is a short discharge of electric energy caused by the sudden release of an electrostatic build-up of electrical charge. If ESD-induced currents flow suddenly and strongly through electronic components, the high currents can literally melt the carefully formed layers of an IC. A chip is particularly susceptible to ESD when it is not mounted into a larger circuit (e.g., mounted onto a printed circuit board). ESD protection is therefore particularly important in maintaining the reliability of semiconductor products, and commercial ICs are generally expected to sustain without damage an ESD event in excess of 2000 volts, which is often denoted as the human-body-model ESD voltage.

Semiconductor devices are becoming increasingly complex, and at the same time the devices' circuitry is becoming smaller and more crowded on the devices to accommodate the new and complex functions. The decreased size and spacing of the interconnections and internal circuit elements, along with the increasing use of multiple input voltage levels, increases the devices' susceptibility to ESD events occurring on the devices' power supply lines. An additional challenge is to protect the devices' internal circuitry from the ESD voltages and currents that are borne in by the ICs' address, data, and control lines.

Due to the difference of the voltage levels between them, the power lines and power pins of an IC are usually electrically isolated from each other, such that the internal power supplies are derived from the external supplies but are often of different voltages. Such isolation, however, may make for devices that are more susceptible to ESD damage in the devices' interface circuits, even though there may be suitable ESD protection circuits placed around the input and output pads of the IC. Examples of prior-art ESD control approaches are disclosed in the following references: N. Maene, et al., *On Chip Electrostatic Discharge Protections for Inputs, Outputs, and Supplies of CMOS Circuits*, 1992 PROC. EOS/ESD SYMP. 228; M. D. Ker and T. L. Yu, *ESD Protection to Overcome Internal Gate-Oxide Damage on Digital-Analog Interface of Mixed-Mode CMOS IC's*, 36 J. MICROELECTRONICS & RELIABILITY 1727 (1996); M. D. Ker, et al., *Whole-Chip ESD Protection for CMOS VLSI/ULSI with Multiple Power Pins*, PROC. IEEE INT'L INTEGRATED RELIABILITY WORKSHOP 124 (Oct. 16–19, 1994); M. D. Ker, *Whole-Chip ESD Protection Scheme for CMOS Mixed-Mode IC's in Deep-Submicron CMOS Technology*, PROC. IEEE CUSTOM INTEGRATED CIRCUITS CONF. 31, Santa Clara, Calif., USA, (May 5–8, 1997).

ESD protection circuits are generally more robust in their design than other circuits on a semiconductor device. An ESD circuit will typically redirect ESD voltage and current to an alternate path that is better able to conduct the ESD current and therefore withstand the stresses of the ESD event while protecting the other circuits. In general, ESD protection circuits are located near the device interconnect pads. There are many known configurations of ESD protection circuits. Specific novel implementations of gate-driven clamp circuits are discussed in this application. Some prior-art gate-driven clamp circuits are described in: U.S. Pat. No. 4,855,620 (C. Duvvury et al.); U.S. Pat. No. 5,086,365 (C. D. Lien); C. Duvvury et al., *Dynamic Gate Coupling Of NMOS for Efficient Output ESD Protection*, 1992 PROC. IRPS. 141; C. Duvvury et al., *Achieving Uniform NMOS Device Power Distribution For Submicron ESD Reliability*, 1992 TECH. DIG IEDM. 131; Ming-Dou Ker et al, *EOS/ESD Reliability of Deep Sub-Micron NMOS Protection Devices*, 1995 PROC. OF IRPS 284; S. Ramaswamy et al., *Capacitor-Coupled ESD Protection Circuit for Deep-Submicron Low-Voltage CMOS ASIC*, 4 IEEE TRANS. VLSI Sys. 307 (Sep. 1996); U.S. Pat. No. 5,631,793 (M. D. Ker et al.).

Clamp circuits work during ESD events to provide a current path from the input pad or power supply to the substrate bias voltage supply, VSS, which is normally ground, or to another circuit element that is equipped to absorb the ESD current. In a conventional power supply clamp circuit, the power supply line is routed to ground through a clamp transistors that is biased to be "off" during normal circuit operation. When a voltage in excess of the maximum allowed voltage on a power supply line is detected by the ESD protection circuit, the clamp transistor will turn "on," thereby shunting the induced ESD potential to ground. Coupled resistor-capacitor circuits ("RC circuits") may also be used at power supply inputs to absorb transient power spikes from ESD events. Examples of such circuits are further described in the following references: C. Duvvury et al., *Dynamic Gate Coupling of NMOS for Efficient Output ESD Protection*, 1992 PROC. OF IRPS 141; C. Duvvury et al., *Achieving Uniform NMOS Device Power Distribution For Submicron ESD Reliability*, 1992 TECH. DIG. 131; S. Ramaswamy et al., *EOS/ESD Reliability of Deep Sub-Micron NMOS Protection Devices*, 1995 PROC. IRPS. 284.

As mentioned above, chip designs sometimes support multiple power levels, with for example one power level provided for internal or core circuitry, and with another power level provided for external circuitry. In these circumstances, the external circuitry typically has a voltage level above the internal or core circuitry of the chip designs. For example, the semiconductor technology for one chip design may use 1.8 or 2.5 volts internally, which yields other advantages such as reduced component size and power conservation. The chip's external interface, however, may need to be compatible to a 3.3 volt external voltage, which requires that the chip's external interface accept and, depending on application, drive, 3.3 volt interfaces.

Multiple power-level designs, however, can pose ESD protection challenges, as is detailed by Ming-Dou Ker & Chien-Hui Chuang, *Electrostatic Discharge Protection for Mixed-Voltage CMOS I/O Buffers*, 37 IEEE J. SOLID-STATE CIRCUITS 1046 (2002). The present application describes an architecture that provides a robust ESD protection method without encountering the difficulties previously associated with the described mixed-voltage circuits.

SUMMARY

Disclosed below are clamp-circuit embodiments that meet the ESD protection objectives of mixed-voltage circuits. These embodiments comprise improved ESD protection circuits for mixed-voltage-tolerant ICs in which the IC inputs are operable to receive signal voltages higher than the ICs' internal or "core" power supply voltage. In an exemplary embodiment, the ESD protection circuits are implemented using a single gate oxide, as contrasted to ESD protection circuits employing transistors having a thicker and therefore more durable gate oxide than is used for the core devices. The use of the single gate-oxide thickness is enabled at least in part by providing for multiple clamp circuit bias inputs and by the cascading of devices between the higher-voltage "VD33" input and ground so as to keep the voltages applied across devices at the devices' designed-for voltage ratings.

The exemplary embodiment uses a voltage bias circuit, a resistor/capacitor trigger, and a cascaded gate NMOS clamp. A bias circuit connected to the cascaded clamp operates to positively assert two or more bias inputs upon the detection of an ESD event that has caused the external or VD33 voltage level to substantially exceed its normal operational voltage. That the circuit is only triggered above the VD33 voltage level means that the ESD protection circuit will avoid interfering with the ESD protection circuit during normal circuit operation. Design of the circuit can be realized using currently available devices and design techniques, thereby offering ease of design and proven reliability. The use of the two or more positively asserted bias voltages enables the turning on of multiple cascaded clamping transistors in the ESD protection circuit.

The embodiments provide the speed and reliability of gate-driven clamp circuits while also providing for ESD protection in mixed-voltage systems. Advantages of the disclosed embodiments include: the ability to have a stepped power-on sequence in which the internal or "core" supply is turned on, followed by a turning on of the power supply to the input/output (I/O) supply; the use of a single-gate oxide to implement a multiple-voltage-capable ESD protection circuit; the implementation of an ESD protection circuit having minimal DC current leakage; and the use of conventional, reliable device configurations for an ESD protection circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE EMBODIMENTS

Figure 1:
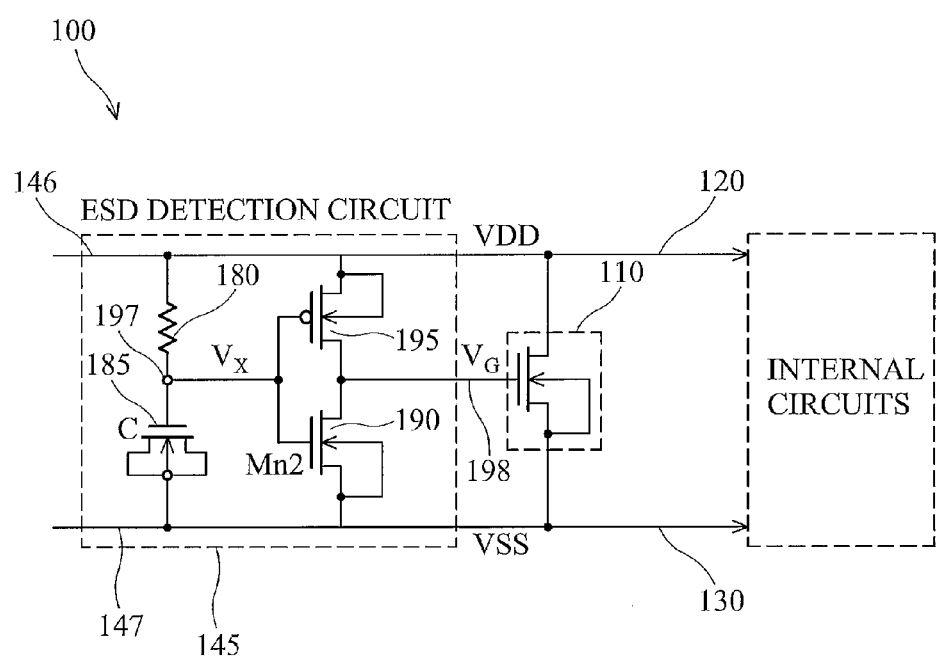
FIG. 1 illustrates a prior-art, gate-driven NMOS clamp circuit for ESD protection.

FIG. 1 illustrates a prior-art input gate-driven NMOS ESD protection circuit 100 in the context of a power supply voltage source to substrate biasing voltage source (VDD-to-VSS) ESD protection circuit using the gate-driven clamping technique. In this embodiment, the ESD protection NMOS transistor 110 has its drain connected to the power supply voltage source VDD 120 and its source connected to the substrate biasing voltage source VSS 130. The ESD detection circuit 145, which in this illustration includes an RC timing circuit comprising resistor 180 and capacitor 185, has its input ports 146, 147 respectively connected to the power supply voltage source VDD 120 and to the substrate biasing voltage source VSS 130.

In addition to the resistor 180 and capacitor 185 of the RC timing circuit, the ESD detection circuit 145 includes an NMOS buffer transistor 190 and a PMOS buffer transistor 195, which buffer and invert the voltage "Vx" coming from the RC timing circuit 180/185. The resistor 180 is connected between the input port 146, which is connected to the power supply voltage source, VDD, and to the common connection 197 of the gates of the NMOS buffer transistor 190 and the PMOS buffer transistor 195. The capacitor 185 in this embodiment is formed of an NMOS transistor having its gate connected to the commonly connected gates of the NMOS buffer transistor 190 and the PMOS buffer transistor 195. The drain, source, and bulk of the NMOS transistor that forms the capacitor 185 are commonly connected to the input port 147 of the ESD detection circuit connected to the substrate biasing voltage source VSS 130.

In the prior-art embodiment of FIG. 1, the resistor 180 and the capacitor 185 are chosen to have an RC time constant from approximately 0.1 to 1.0 microseconds. The RC circuit 180/185 operates to detect the ESD transition across VDD 120 and VSS 130. The ESD protection NMOS transistor 110 is quickly turned on to clamp the ESD overstress voltage across VDD and VSS.

Under normal (DC) operating conditions for the VDD/VSS levels, the capacitor 185 is charged to the voltage level VDD, resulting in transistor 190 being in an "on" state due to its high gate voltage and transistor 195 being in an "off" state due to its conversely low gate voltage. Therefore, in normal conditions, the transistor 190 that has its source connected to the substrate bias voltage VSS 130, which keeps the ESD protection transistor 110 biased in an "off" state. The RC time constant set by resistor 180 and capacitor 185 is set to quickly detect ESD events while also providing sufficient time for the ESD charge to dissipate.

Still referring to FIG. 1, when an ESD event occurs, the inverter comprised of transistors 190 and 195 will change state and quickly trigger the ESD protection transistor 110 to clamp the ESD voltage on the power line between the voltage source VDD 120 and the substrate bias voltage VSS 130. A clamp circuit such as this can also be used at device inputs, outputs, address lines, and control lines, and will work correctly when the relevant pin voltages are within the limits of the device power supply. Such conventional clamp circuits fail, however, in mixed-voltage designs where the internal device power supply is lower than the pin voltages for the I/O lines, address lines, or control lines.

Figure 2:
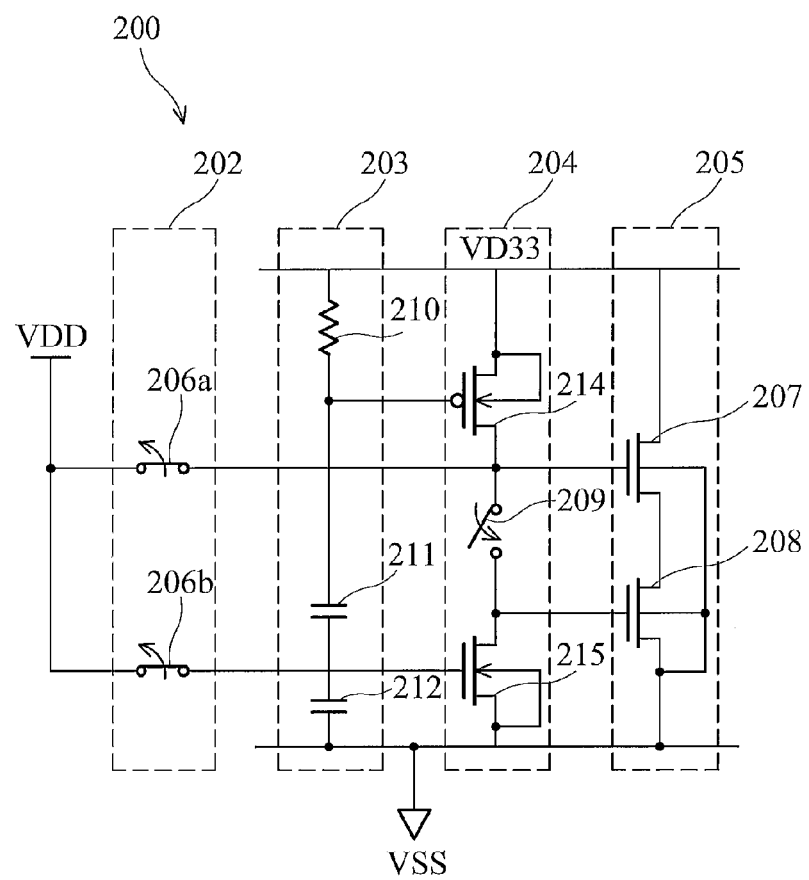
FIG. 2 is a conceptual block diagram of a multiple-voltage-input ESD protection circuit using a cascaded, gate-driven NMOS clamp.

FIG. 2 illustrates an embodiment in which an ESD protection circuit 200 protects the internal circuitry of a mixed-voltage semiconductor device. The circuit 200 compensates for the different voltage levels while still providing a robust clamp circuit for ESD protection. For this exemplary embodiment, an internal or "core" 1.8 volt power supply VDD is assumed, while the circuit 200 is designed to accommodate I/O signals of higher levels, such as, for example, 3.3 volts on the illustrated "VD33" supply line. The designs described in this application, however, are not to be limited to the specific voltages described. Specifically, the presently described embodiments may be able to accommodate different multiple voltage levels with or without specific adaptation.

The ESD protection circuit 200 specifically illustrates a block diagram for a clamp circuit 205 that is biased to the external 3.3V power supply on VD33. Since the external interconnects are referenced to VD33, the main ESD discharge path for the clamp 205 is between VD33 and the substrate reference voltage VSS. Under normal operations, the switch 206a in the control section 202 is closed, allowing the VDD supply to bias the source terminal of the transistor 207 to the VDD voltage, which, in a design in which the VDD voltage supply is at least one half of the VD33 voltage, keeps the transistor 207 from being biased beyond its designed-for voltage. The switch 209 in the inverter section 204 is also in an open position during normal operation, which prevents a current path from existing through the drain-source channel of the transistor 215, thereby also turning off the transistor 208, which is biased at its gate by the transistor 215, which in turn because its gate is biased to VDD by the closed switch 206b will sink any possible current existing at the transistor's 205 drain and draw down the connection driving the base of the transistor 208 to approximately 0 volts.

As an ESD event occurs, the switches 206 in the control section 202 are designed to open, and the switch 209 in the inverter section 204 is designed to close. Further at that time, because of the high voltage (e.g., 2 kV) placed on VD33 by the ESD event, which in turn is placed on the source and substrate of the PMOS transistor 214, the relative voltage on the gate of the PMOS transistor 214 is in relative effect 0 volts. The ESD-heightened VD33 voltage would then be directed through the PMOS transistor 214, and accordingly would positively assert or bias the gates of both of the clamp transistors 207, 208 to a high voltage so as to turn those clamp transistors "on." The clamp transistors 207, 208 then conduct to direct the ESD current from VD33 to ground. This current conduction is further heightened by body current conduction, in which a parasitic bipolar junction transistor is formed by an NPN transistor formed by the two transistors in their common substrate or well.

At the same time, the RC circuit section 203, comprising resistor 210 and capacitors 211 & 212, triggers the inverter section 204. The capacitors are separated to provide RC time constant controls for both transistors 214 and 215. By providing these separate capacitors and biases, reliably safe voltage bias voltages are provided to both transistors 214 and 215. Over the time constant of the RC circuit provided by series capacitors 211, 212, and resistor 210, the voltage at the gate of the PMOS transistor 214 is gradually pulled up to the VD33 voltage level and accordingly transistor 214 begins to turn off. Over the time constant of the RC circuit, the capacitor 212 is charged, pulling up the voltage to the gate of the NMOS transistor 215 and gradually turning that transistor on. As the transistors 214 is turned off while transistor 215 is turned on, the clamp circuit 205 comprising transistors 207 and 208 also begins to turn off, with the idea that the RC time constants should be set sufficiently long to outlast the duration of the ESD event.

Figure 3:
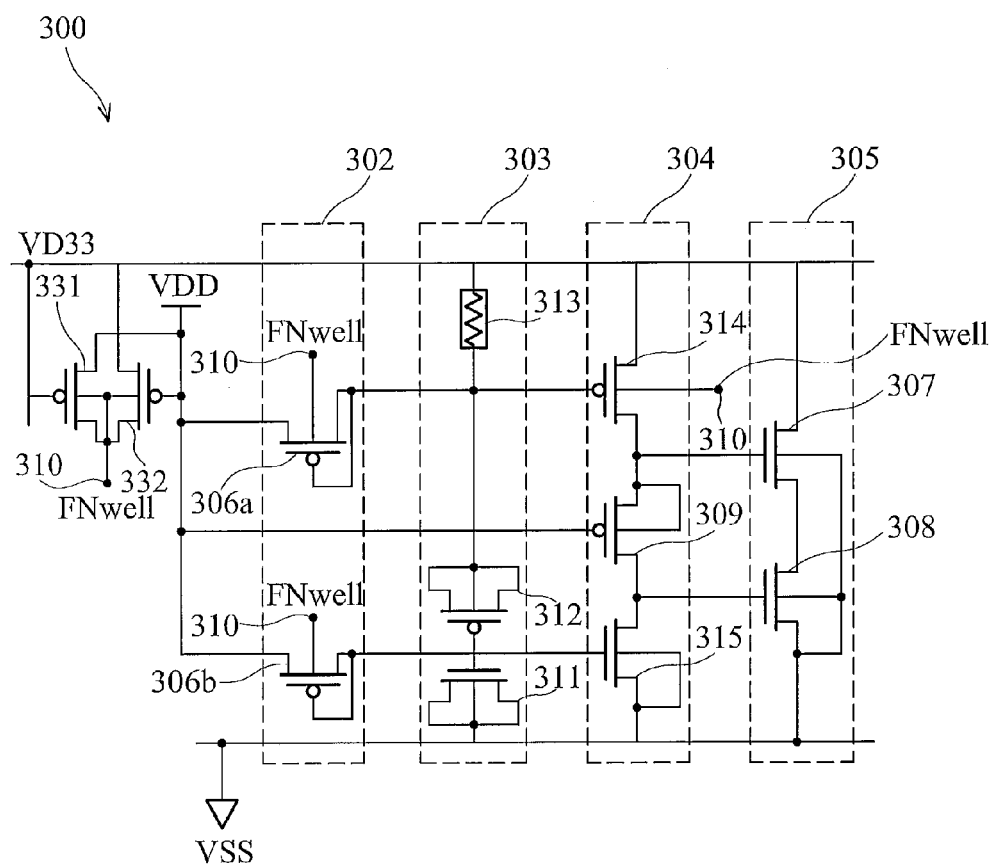
FIG. 3 illustrates a circuit element schematic of an implementation of the block diagram of FIG. 2.

FIG. 3 illustrates a schematic of a circuit 300 that can be used to provide the mixed-voltage ESD protection method described above. The FIG. 3 circuit 300 is a cascaded, gate-driven NMOS ESD clamp, which provides ESD protection in a mixed-voltage-tolerant design. The switches 306 in the control section 302 comprise PMOS transistors within floating n-wells. These switches are self-biased or self-controlled such that they will only pass a high voltage on VDD, but such that they will be open to low-voltage signals. Under normal circuit operation, the switches 306 are self-biased and the switch is effectively closed. Accordingly, the drains of the transistors 306, which are also tied to the gates of the transistors, are self-biased to VDD, which in the described embodiment is 1.8 volts. The floating n-wells under normal circuit operation are biased to the power supply VD33 by the PMOS transistor pair 310, which minimizes or nearly eliminates leakage currents through the switches 306. The transistor 309, conversely, remains "off" under normal conditions due to the VDD voltage (in example, 1.8 volts) placed upon its gate relative to its normally biased drain voltage of VDD (in example, 1.8 volts). Because there is no current path into the gate of transistor 308 due to transistor 309 being off, then transistor 308 remains off during normal operation and the clamp circuit 300 (and the clamp section 305) will not affect normal core or interface circuit operation.

Because of the PMOS transistor switch 306a being self-biased to an "on" state and passing through the VDD voltage, the common drain/source node between the transistors 314, 309 are biased normally to VDD, which in the present example would be 1.8 volts. This biasing arrangement provides protection for the PMOS transistor 314, because otherwise it could see the full effect of the higher external bias voltage, VD33, which in the present example is 3.3 volts. Since the transistors 307, 308, 309, 314 and 315, are designed for operation at a lower internal VDD power supply, they will generally be degraded if they are exposed to voltages that are higher than their designed voltage-handling capability (in this case, the transistors are designed for Vgs=Vgd=VDD=1.8 volts). By this special circuit design, the same gate oxide thicknesses can be used for transistors of the ESD protection circuit 300 as are used for the core circuits, despite the fact that the ESD protection circuit 300 will be protected during normal operation to a higher-level external voltage. The circuit design accomplishes this mixed-voltage tolerance by using cascaded circuits to divide the operational voltages among the circuit elements. Similarly, the VDD voltage, and not the VD33, is applied to the gate of the transistor 315. It is the capacitor 312 that provides DC voltage protection for the gate of the transistor 315 such that the VD33 voltage coming from the resistor 313 is blocked on a DC level by the capacitor 312.

The circuit 300 comprises an RC timing circuit 303, which includes a resistor 313 and capacitors 311, 312. The capacitor 311 is formed from an NMOS transistor which has its source and drain terminals connected to the substrate bias voltage VSS, and the capacitor 312 is formed from a PMOS transistor which has its source and drain connected to the substrate resistor 313 and the gate of PMOS transistor 314. These capacitors and resistor form an RC time constant, which, as mentioned above with respect to FIG. 2, may be set in the range of 0.75 μsec to 1.5 μsec to detect an ESD potential across the VD33 power supply and maintain the clamp for the RC time constant, allowing the charge to dissipate.

When an ESD event occurs on VD33, the VDD voltage will be comparatively at a "0" voltage relative to the kV magnitude voltage pulses (e.g., 1 kV, 2 kV, 3 kV) that are applied to VD33 from ESD events. The self-biased or self-controlled PMOS transistors 306 will be turned off, and as switches they will be opened. Further, the relatively low voltage on the gate of the PMOS transistor 309 will turn on the transistor, effectively closing the circuit through its drain/source channel. Because of the relatively low voltage on the gate of the PMOS transistor 314, which will be initially maintained after the ESD event at its original VD33 level due to the RC time constant of the resistor 313 and series capacitors 311, 312, the transistor 314 will be "on" and will provide a high voltage to the gates of both of the NMOS transistors 307, 308. These transistors will accordingly conduct strongly to draw the ESD current from VDD33 down to VSS. As discussed with respect to FIG. 2, a substrate BJT current will draw directly through the device substrate for the two clamp transistors 307, 308, effectively discharging the ESD current.

The two bias lines provided to the two clamp transistors 307, 308 provide for a division of voltages from the top-level VD33 voltage in order to ensure that over-voltages do not stress the transistors of the circuit. The PMOS transistor 309 provides for the connection of the two bias voltages to turn on both clamp transistors, 307, 308 during ESD events at which times the transistors should be turned on to conduct current to ground. The voltages are similarly divided or "cascaded" among the control transistors 309, 314, and 315 to ensure that these transistors are not overstressed by high voltages during normal circuit operation. Although the circuits of FIGS. 2–3 are described generally as having two or three devices cascaded to avoid overstressing the components, a higher-level of cascading could be accomplished using similar techniques to handle higher voltages or according to other design needs.

Also provided in FIG. 3 is a floating N-well 310, which is supplied with power by transistors 331 and 332 and which is provided to protect the circuitry during the device power-on. The situation to be avoided is during power-on applying VD33 suddenly across the gate of one of the transistors that was originally at a zero-volt level. By first applying a 1.8 volt potential to the FNWell 310 of those transistors, the next step up to 3.3 volts will then not be damaging to the device. The FNWell 310 accordingly provides the ability to have a two-step power-on process in which the N-well voltage is increased to ensure that an overvoltage is not provided on power-up to one of the p-type devices relative to their N-well substrate. This is accomplished by first powering on the internal VDD "core" power supply, after which the VD33 supply is powered on. When the VDD supply is turned on with VD33 low, the left PMOS transistor 331 is turned on and VDD is connected to the FNwell voltage level. When the VD33 is then turned on, the VDD voltage applied to the right transistor 332 is accordingly lower and that PMOS transistor is turned on, applying the VD33 voltage to the FNWell. At the same time, the high voltage to the gate of the left transistor 331 would turn off that PMOS transistor thereby avoiding having VDD connected to VD33 through the transistors 331, 332.

While this method has been particularly shown and described with reference to the disclosed embodiment thereof, it will be understood by those skilled in the art that various other changes and combinations in form and details may be made without departing from the spirit and scope of the method. For example, although the illustrated structure uses certain types of transistors, p-channel and n-channel MOSFETs, in certain combinations, other combinations and types of transistors may be used to accomplish the described embodiments. Resistors and capacitors may be active devices or modified MOSFETS, or there may be separately formed integrated circuit elements. For example, a resistor may be comprised of an active load transistor or it may be formed by depositing a vertical or serpentine planar polysilicon or amorphous silicon device. While certain biasing arrangements have been used, other biasing arrangements that are designed to keep over-design voltages off of circuit elements.

The described semiconductor device type may be single-well or double-well CMOS, or the described semiconductor device may be formed using other device technologies. Certain components may be added to or subtracted from the ESD circuit according to design needs. For example, instead of the external circuit power supply ("VD33") being 3.3 volts, the power supply could be 5 volts with the internal core supply still being at 1.8 volts. In that example, a three-input bias and circuit cascade may be effective. Further, the above-described circuit may work with or without architectural modification in the situation where the internal "core" voltage is 3.3 volts and the external voltage is 5 volts or 6 volts. While the gate layers are described as being consistently formed for both the transistors of the ESD protection circuit 300 and internal or "core" circuits, the advantages described above even in scenarios where separate gate layers are formed for the ESD protection and other core circuits. Sources and drains of MOS transistors shall be construed according to context, and for purposes of construction of the claims of this application a "source" or a "drain" shall be construed broadly as a source/drain or non-gate connection of a MOS transistor. Beyond that construction, no specific MOS transistor orientation should be inferred from the designation of a certain connection being the source connection or the drain connection of an MOS device.

In accordance with the above discussion of alternatives and constructions, the appended claims shall be construed to encompass any such modifications or embodiments that are not precluded from the construction.

What is claimed is:

1. An ESD protection circuit connected between a first terminal and a second terminal of an integrated circuit, the ESD protection circuit comprising:

a charge dissipation circuit, having more than one bias inputs, that is operable to direct ESD current from one terminal to the other with a relatively low resistance according to signals received in the charge dissipation circuit by the more than one bias inputs to the charge dissipation circuit;

an ESD detection circuit connected to the first and second terminals and operable to detect an ESD event comprising detecting when a large voltage has been induced between the first and second terminals and to provide, upon that event, a control signal that is indicative of the detected large voltage;

a bias control circuit connected to the ESD detection circuit and operable upon receipt of the ESD detection circuit's control signal to assert the more than one bias inputs; and a timing circuit within the ESD detection circuit that is operable in conjunction with the bias control circuit to generate a first timing signal that is operable to maintain a first of the bias inputs as positively asserted for a first substantially certain time and a second timing signal that is operable to maintain a second of the bias inputs as positively asserted for a second substantially certain time.

2. An ESD protection circuit according to claim 1 wherein the bias control circuit contains a transistor switch that is operable to substantially electrically connect together at least two of the more than one bias inputs in response to the control signal whereby both of the at least two bias inputs are positively asserted substantially together.

3. An ESD protection circuit according to claim 2 wherein the control signal substantially drives a gate of the transistor switch.

4. An ESD protection circuit according to claim 1, wherein the timing circuit is an RC timing circuit.

5. An ESD protection circuit according to claim 1, wherein the charge dissipation circuit comprises a clamp circuit.

6. An ESD protection circuit according to claim 5, wherein the clamp circuit comprises a series connection of an upper and a lower MOS transistor, wherein the upper MOS transistor is connected to the first terminal at its drain, wherein the lower MOS transistor is connected to the second terminal at its source.

7. An ESD protection circuit according to claim 6, wherein the upper and lower MOS transistors are connected together at their source and drain, respectively.

8. An ESD protection circuit according to claim 1 wherein the ESD detection circuit comprises self-controlled switches that are opened upon an ESD event.

9. An ESD protection circuit according to claim 8 wherein the self-controlled switches are p-channel transistors formed in one or more floating n-wells that rise with the ESD voltage such that the p-channel transistors will block a core supply voltage applied to their inputs.

10. An ESD protection circuit according to claim 1 wherein the bias control circuit comprises a plurality of cascaded series transistors that are biased by a core power supply such that none of cascaded transistors are exposed to the entire voltage across the first and second terminals.

11. An ESD protection circuit according to claim 1, wherein the first timing signal is driven by a first RC time constant subcircuit, wherein the second timing signal is driven by a second RC time contact subcircuit, and wherein the first and second RC time contact subcircuits are cascaded with a bias voltage interposed between them such that neither of the first and second RC time constant subcircuits are exposed to the entire voltage across the first and second terminals.

12. A biasing circuit for a mixed-voltage interface circuit between a circuit having a lower, core supply voltage and a higher, I/O supply voltage, the biasing circuit comprising:
 a) a core voltage node;
 b) an I/O voltage;
 c) at least one floating reference voltage node;
 d) a dual-supply switch to the floating reference voltage node comprising
  i. a core supply switch operable to bias the floating reference node to the core supply voltage when the I/O supply voltage is low, and
  ii. an I/O supply switch operable to bias the floating reference node to the I/O supply voltage when the I/O supply voltage is high.

13. A biasing circuit according to claim 12, wherein the I/O supply switch is operable to bias the floating reference node to the I/O supply voltage when the I/O supply voltage is high relative to the core supply voltage.

14. A biasing circuit according to claim 12, wherein the core and I/O supply switches are PMOS transistors.

15. A biasing circuit according to claim 14, wherein the PMOS transistors are formed in a common N-well and wherein the N-well comprises the floating voltage reference node.

16. A biasing circuit according to claim 12, wherein the mixed-voltage interface circuit is a cascaded ESD clamp circuit and wherein the floating voltage reference node provides a substrate bias to at least one transistor that directly or indirectly drives a transistor within the cascaded ESD clamp circuit.

17. A method of biasing a mixed-voltage interface circuit between a circuit having a lower, core supply voltage and a higher, I/O supply voltage,
 the method comprising:
 a) providing a floating voltage reference node;
 b) applying the core supply voltage to the floating voltage reference node;
 c) waiting a sufficient time for the mixed-voltage interface circuit to become biased to the core supply voltage; and
 d) applying the I/O supply voltage to the floating voltage reference node.

18. A method according to claim 17, wherein the floating voltage reference node receives the internal and external supply voltages through a pair of PMOS transistors, wherein one of the PMOS transistors passes through the internal supply voltage and is enabled when the external supply voltage is low and wherein the other of the PMOS transistors passes through the external supply voltage and is enabled when the external supply voltage is high.

* * * * *